Dec. 23, 1969 J. E. ZIDO 3,486,084
ENCAPSULATED SEMICONDUCTOR DEVICE
Filed March 19, 1968
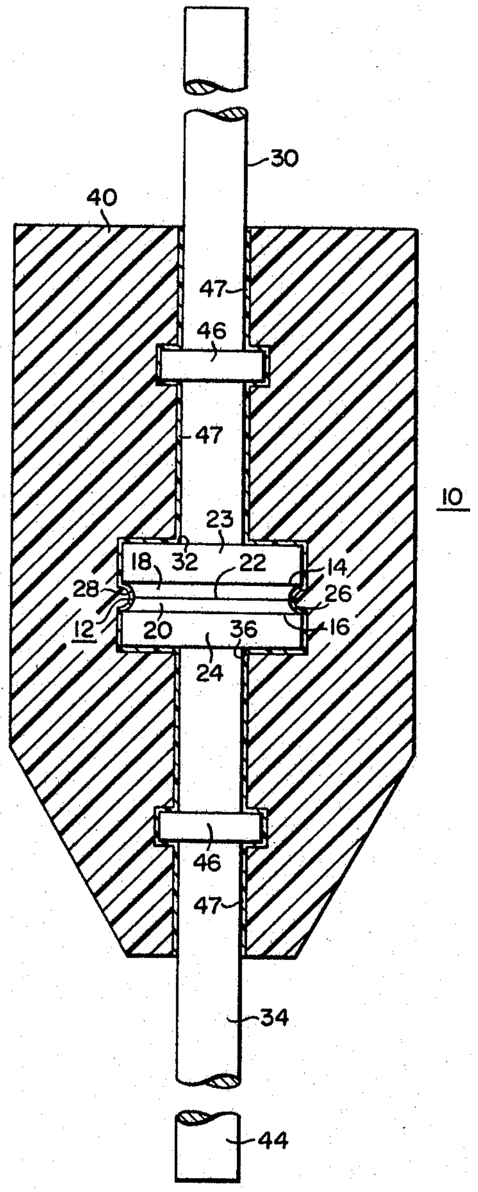
WITNESSES
Edwin E. Basler
Lee P. Johns
INVENTOR
Joseph E. Zido
BY
L. L. Menzemer
ATTORNEY

United States Patent Office 3,486,084
Patented Dec. 23, 1969

3,486,084

ENCAPSULATED SEMICONDUCTOR DEVICE

Joseph E. Zido, Donora, Pa., assignor to Westinghouse Electric Corporation, Pittsburgh, Pa., a corporation of Pennsylvania Filed Mar. 19, 1968, Ser. No. 714,173
Int. Cl. H01l 3/00, 5/00
U.S. Cl. 317—234 8 Claims

ABSTRACT OF THE DISCLOSURE

An encapsulated semiconductor device including a resinous housing containing a semiconductor element and metal contacts having metal leads extending therefrom and through the housing, and an adhesive primer on the inter surfaces of the housing, the contacts, and the leads.

BACKGROUND OF THE INVENTION

Field of the invention

This invention relates to a resinous encapsulated semiconductor device and, more particularly, it pertains to such a moisture-proof device.

Description of the prior art

One of the present disadvantages of resinous encapsulated semiconductor devices is the relatively poor resistance to moisture when compared to metal encapsulated devices. The inability of existing molded resinous devices to satisfactorily pass tests for moisture resistance is due primarily to the inadequacy of the bond between the resinous material and the metal. Present manufacturing practices rely principally upon exposing chemically cleaned metal surfaces to the wetting action of the resin melt during the mold cycle. However, to obtain maximum wetting of the metal parts during the encapsulation process, the molding parameters must be optimized and correlated to the flow characteristics of the encapsulating material such as an epoxy resin.

Although epoxy resins have satisfactory adhesion qualities with most metal substrates, the epoxy tends to separate from the metal during temperature excursion because of the differences in the coefficients of thermal expansion between the metal and the epoxy. The degree of adhesion between the epoxy and metal parts determines the degree of hermeticity because the density of the epoxy is sufficient to resist moisture penetration.

Associated with the foregoing has been a requirement with prior constructions of semiconductors encapsulated in epoxy to provide a resilient resinous cushioning body preferably of an elastomeric silane to eliminate stresses on the semiconductor wafer that are set up during curing of the epoxy.

In accordance with this invention it has been found that a moisture-proof joint between the epoxy and metal surfaces may be obtained by the preliminary application of a primer adhesive film of polyvinyl butyral resin on the metal parts prior to the application of the molded epoxy on the metal. For that purpose the metal surfaces are chemically or mechanically treated to enhance the strength of the primer bond.

Accordingly, it is a general object of this invention to provide an encapsulated semiconductor device having acceptable standard commercial humidity resistance requirements.

It is another object of this invention to provide a method for making an encapsulated semiconductor device having a humidity resistance bond between the epoxy and the metal.

SUMMARY OF THE INVENTION

Briefly, the encapsulated semiconductor device of the present invention comprises a semiconductor element, a metal contact in surface-to-surface contact with the element and having a metal lead extending therefrom, an epoxy resin housing encapsulating the element, contact, and lead, an adhesive film on the surfaces of the element, the contact, and the lead which surfaces are in contact with the housing, and the adhesive film bonding the housing to the element, contact, and lead in a fluid-tight manner.

DESCRIPTION OF THE DRAWING

For a better understanding of the invention, reference is made to the attached drawing which is a sectional view of a resin encapsulated diode embodying the present invention.

In accordance with the invention a semiconductor device 10 comprising a wafer 12 of a semiconductor material as, for example, silicon. The wafer 12 has a top surface 14 and a bottom surface 16 which are substantially parallel. The wafer 12 has a region 18 of a first-type of semiconductivity and a region 20 of a second-type of semiconducivity and a p-n junction 22 present between the regions 18 and 20.

A first metal electrical contact 23 is affixed to the top surface 14 of the wafer 12 and a second metal electrical contact 24 is affixed to the bottom surface 16 of the wafer 12. The metal contacts consist of at least one metal selected from the group consisting of molybdenum, tungsten, tantalum, and base alloys thereof.

An electrical lead 30 is joined by soldering or brazing an end 32 of the lead 30 to contact 23 and a second electrical lead 34 is joined to contact 24 by soldering or brazing an end 36 of lead 34 to contact 24. Preferably, but not necessarily, the edges 26 of the wafer 12 are etched after the wafer 12 has been joined to the contacts 23 and 24. The edges 26 and 28 of the wafer 12 are concave inwardly toward the center of the wafer to make the wafer less susceptible to stresses incurred during curing of the epoxy resin forming a housing 40. Thus, the wafer 12 can be encapsulated within the housing 40 of a cured epoxy resin without employing any cushioning means as is required in prior art devices.

The cured epoxy resin employed to form the housing 40 is substantially impervious to moisture and exhibits substantially no shrinkage when heated to high temperature. One suitable epoxy resin is that sold by Pacific Resins and Chemical, Inc. under the designation EMC90.

End portions 42 and 44 of the leads 30 and 34 extend beyond the body 40 to facilitate making electrical contact to the device 10. A flange or collar 46 is provided on the end portions 42 and 44 to avoid longitudinal displacement of the end portions within the housing.

It is a critical feature of this invention that the surfaces of the several parts 23, 24, 30, and 34 that contact the epoxy housing 40 are initially provided with a coating or film 47, described below, which promotes a high degree of adhesion between the several parts and the epoxy housing.

It has been found that exceptionally outstanding adhesion is obtained if the metal parts are coated with a film composed of a material selected from a group consisting of (1) a solution of polyvinyl butyral resin, (2) a 3% to 25% solution of an orthophosphoric acid, and (3) a mixture of (1) and (2). More particularly, the solution (1) of polyvinyl butyral resin preferably has a molecular weight such that it readily dissolves in an isopropanol-water azeotrope (about 12% water) to produce a 3 to 15% resin solids solution. The resin is an admixture of from about 10 to 50% by weight of finely divided solids. A satisfactory solid filler is one comprised of a major portion of zinc chromate and a minor portion of magnesium silicate with small amounts of aluminum and calcium silicates present. As a specific example, a suspension in a propanol-water azeotrope of from 12% by weight of polyvinyl butyral and 10.5% by weight of substantially equal parts of zinc chromatic and magnesium silicate of micron size particles, gave good results.

Good results were obtained using a 10% solution of orthophosphoric acid in isopropanol-water azeotrope.

A mixture of the solutions (1) and (2) produces very satisfactory adhesion by mixing four parts by weight of the polyvinyl butyral resin with one part of a 10% orthophosphoric solution in isopropanol-water azeotrope whereby the polyvinyl butyral resin is polymerized in situ.

The polyvinyl butyral film of from 2 to 8 mils in thickness is coated over the metal parts. Excellent results have been obtained with a film thickness averaging 5 mils. After dipping in the bath of the primer, the primer coated parts are air dried for 2 to 8 hours and baked in circulating air, dry air, or an inert atmosphere at a temperature ranging from about 100° to 300° C. for a period of from 4 to 20 hours, a preferred temperature being 250° C. for 16 hours, to cure the polyvinyl butyral primer.

Prior to applying the composition resulting in film 42 to the metal parts, the parts are thoroughly cleaned. In addition, a maximum interface area between the film and the metal surface is provided by chemically etching, such as with orthophosphoric acid, or mechanically pitting the metal surface to increase adherence of the film to the metal surface.

Epoxy encapsulated semiconductor devices which were prepared with the primer film 47, as described, and transfer molded in epoxy resin were found to resist moisture penetration as determined by a so-called "pressure cooker" test of 15 p.s.i.g. live steam for 2 hours. No short circuits or separation of the resin from the device were noted after this test. By comparison most prior art devices failed under these test conditions.

Accordingly, the device and method of the present invention provides highly acceptable hermetic epoxy resin encapsulated semiconductor device in accordance with accepted commercial humidity resistance requirements. The degree of adhesion between the epoxy and metal parts determines the degree of hermeticity because the integrity of the epoxy resin body is sufficient to resist penetration of moisture when properly molded.

It is understood that the above specification and drawing are merely exemplary and not in limitation of the invention.

What is claimed is:

1. A hermetically sealed electrical component comprising a semiconductor wafer having electrical leads, a housing composed of a molded epoxy resin encapsulating the wafer, the electrical leads extending outwardly from the housing, an adhesive film on the surfaces of the wafer and leads and the housing, the adhesive film consisting of a material selected from a group consisting of (1) a solution of a polyvinyl butyral resin of a molecular weight such that it readily dissolves in an isopropanol-water azeotrope to provide a 3% and 15% resin solids solution, (2) a 3% to 25% solution of orthophosphoric acid in isopropanol-water azetotrope, and (3) mixtures thereof, whereby a moisture-proof bond is provided between the housing and the wafer and the leads.

2. The device of claim 1 in which the adhesive film has a thickness of from about two to eight mils.

3. The device of claim 1 in which the adhesive film is composed of a solution (1) of polyvinyl butyral resin having a molecular weight such that it readily dissolves in an isopropanol-water azeotrope to produce a 3 to 15% resin solids solution.

4. The device of claim 1 in which the adhesive film is composed of a solution of a 10% solution of an orthophosphoric acid in isopropanol-water azeotrope.

5. The device of claim 1 in which the adhesive film is composed of a cured polyvinyl butyral resin derived by mixing (a) a solution of a polyvinyl butyral resin of a molecular weight such that it readily dissolves in an isopropanol-water azeotrope to produce a 3% to 50% resin solids solution, and (b) a 10% solution of an orthophosphoric acid in isopropanol-water azeotrope.

6. The device of claim 1 in which the adhesive film is composed of a mixture of solutions (1) and (2) and consists of four parts by weight of the polyvinyl butyral resin with one part of a 10% orthophosphoric solution in isopropanol-water azeotrope which mixture is polymerized in situ.

7. The device of claim 5 in which the adhesive film comprises from about 10% to 40% of finely divided solid filler.

8. The device of claim 7 in which the filler is composed of substantially equal parts of zinc chromate and magnesium silicate.

References Cited

UNITED STATES PATENTS

| | | | |
|---|---|---|---|
| 3,081,374 | 3/1963 | Burch | 317—234 X |
| 3,242,393 | 3/1966 | Pauli | 317—234 |
| 3,416,046 | 12/1968 | Dickson et al. | 317—234 |

JOHN W. HUCKERT, Primary Examiner

R. F. POLISSACK, Assistant Examiner

U.S. Cl. X.R.

317—235